US008334559B2

(12) United States Patent
Akil et al.

(10) Patent No.: US 8,334,559 B2
(45) Date of Patent: Dec. 18, 2012

(54) SEMICONDUCTOR STORAGE DEVICE AND MANUFACTURING METHOD

(75) Inventors: Nader Akil, Sterrebeek (BE); Michiel J. Van Duuren, Valkenswaard (NL)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 253 days.

(21) Appl. No.: 12/780,612

(22) Filed: May 14, 2010

(65) Prior Publication Data

US 2010/0308394 A1     Dec. 9, 2010

(30) Foreign Application Priority Data

May 14, 2009   (EP) ..................... 09160221

(51) Int. Cl.
*H01L 29/788* (2006.01)
(52) U.S. Cl. ....................... 257/316; 438/266
(58) Field of Classification Search .................. 257/316; 438/266

See application file for complete search history.

(56) References Cited

U.S. PATENT DOCUMENTS

| | | |
|---|---|---|
| 5,394,357 A | 2/1995 | Yu |
| 7,276,759 B1 | 10/2007 | Yu et al. |
| 2006/0176736 A1 | 8/2006 | Harari |
| 2008/0291728 A1 | 11/2008 | Terzioglu et al. |

FOREIGN PATENT DOCUMENTS

WO     WO 90/11621     10/1990

OTHER PUBLICATIONS

Search Report and Written Opinion dated Oct. 5, 2009 issued by the European Patent Office in European Application No. 09160221.9, 7 pages.

*Primary Examiner* — Douglas Menz
(74) *Attorney, Agent, or Firm* — Haynes and Boone, LLP (57) ABSTRACT

A semiconductor storage device includes a semiconductor substrate having a first region of a first conductivity type in between respective regions of an opposite conductivity type, at least the first region being covered by a first dielectric layer, a polysilicon floating gate placed on the first dielectric layer over the first region, said floating gate being surrounded by an insulating material; and a metal control gate structure adjacent to the polysilicon floating gate, the metal control gate structure being capacitively coupled to said floating gate. A method of manufacturing such a semiconductor storage device is also disclosed.

19 Claims, 5 Drawing Sheets

FIG. 10

SEMICONDUCTOR STORAGE DEVICE AND MANUFACTURING METHOD

This application claims the priority under 35 U.S.C. §119 of European application number 09160221.9 filed May 14, 2009, the disclosure of which is incorporated herein by reference in its entirety for all purposes.

TECHNICAL FIELD

The present invention relates to a semiconductor storage device comprising a semiconductor substrate having a first region of a first conductivity type in between respective regions of an opposite conductivity type, at least the first region being covered by a first dielectric layer, and a polysilicon floating gate placed on the first dielectric layer over the first region. The present invention further relates to manufacturing such a semiconductor storage device.

BACKGROUND

Such a storage device is very suitable for many applications and as such will be present arranged in rows and columns in devices requiring non-volatile memory. They are e.g. known as (E)EPROM=(Electrically) Erasable and Programmable Read Only Memory. Storage of charge on the floating gate allows the threshold voltage ($V_T$) to be electrically altered between a low and a high value to represent logic 0 and 1, respectively. Such a storage device typically also comprises a control gate for controlling the storage device in read and write mode.

The reduction of the feature sizes of semiconductor devices poses design challenges for the integration of such storage devices in future semiconductor technologies. For instance, conventional designs of such a storage device in which the control gate is located on top of the floating gate require a relatively high voltage for programming the storage device, which makes such arrangements unsuitable for use in semiconductor technologies having a relatively small feature size because such technologies cannot withstand these relatively high voltages.

This problem has been addressed for instance in U.S. Pat. No. 7,276,759, in which a polysilicon control gate is placed adjacent to a poly-silicon floating gate, such that these two gates are capacitively coupled through a dielectric material in between these two gates. As a consequence, the floating gate can be programmed at lower voltages such that this arrangement is suitable for application in semiconductor technologies having reduced feature sizes.

A disadvantage of the known device is that its applicability in deep sub-micron technologies is expected to be limited because of the design rules imposed on the spacing of polysilicon structures therein, which imposes a lower limit on the size of such a device. Also, this approach requires the separation of multiple poly-Si layers by special dielectrics as well as the careful alignment of the various layers, thus adding to the cost of such a device.

SUMMARY

According to a first aspect, there is provided a semiconductor storage device comprising a semiconductor substrate having a first region of a first conductivity type in between respective regions of an opposite conductivity type, at least the first region being covered by a first dielectric layer; a polysilicon floating gate placed on the first dielectric layer over the first region, said floating gate being surrounded by an insulating material; and a metal control gate structure adjacent to the polysilicon floating gate, the metal control gate structure being capacitively coupled to the floating gate.

The use of a metal control gate in such a semiconductor storage device allows for a further reduction of the size of the device due to the fact that in many semiconductor technologies such as CMOS, the required minimum distance between a metal and polysilicon structure as dictated by the design rules is smaller than the required minimum distance between respective polysilicon structures.

The voltage required to program the semiconductor storage device, i.e. migrate charges from and to the floating gate, is inversely related to the amount of capacitive coupling between the floating gate and the control gate. For this reason, it can be advantageous to maximize the capacitive coupling between these gates. This may be achieved by maximizing the surface area of each gate that is exposed to the other gate. This may for instance be achieved by interdigitating the control gate and the floating gate.

In an embodiment, the metal control gate structure is higher than the polysilicon floating gate. This further increases the capacitive coupling between the control gate structure and the floating gate due to the fact that the top part of the polysilicon floating gate exhibits a fringing capacitive coupling with the taller metal control gate.

Alternatively, the metal control gate structure comprises a local interconnect line. Such a structure is also suitable for achieving a significant capacitive coupling with the floating gate.

It is not necessary that the metal control gate structure is formed as a single structure. In an embodiment, the metal control gate structure comprises a plurality of metal portions separated from each other by a further insulating material. This has the advantage that such a metal control gate structure may be used in technologies that do not allow the use of local interconnect lines or metal bars.

In an embodiment, the semiconductor storage device further comprises a second region of the first conductivity type in between one of said respective regions and a further region of the opposite conductivity type, at least said second region being covered by a further dielectric layer; and a further gate placed on the further dielectric layer over the second region. In this embodiment, the semiconductor storage device is a two-transistor cell in which the further gate is the gate of access or enable transistor for enabling access to storage transistor formed by the floating gate, control gate and underlying active regions. The respective dielectric layers underneath the floating gate and the further gate may be the same layers.

Preferably, the semiconductor substrate comprises a plurality of electrically insulated wells, with the respective regions of the first and opposite conductivity types being located within a single one of said wells.

In an embodiment, the metal control gate structure is separated from the semiconductor substrate by a second dielectric layer. This layer may be formed from the same dielectric material as the first dielectric layer. The second dielectric layer may have a different thickness than the first dielectric layer, which has the advantage that tunneling of charge carriers to the control gate is avoided.

In an embodiment, the metal control gate structure partially covers the insulating material. This can be advantageous in deep sub-micron technologies in which the design rules specify a width of the insulating spacer surrounding the floating gate that is larger than the minimum distance between a metal and polysilicon structure. Consequently, a further increase in the capacitive coupling between the control gate and the floating gate is achieved, thus further reducing the required voltage for programming the semiconductor storage device.

The semiconductor storage device typically comprises a metal layer for contacting respective active regions of the semiconductor storage device. In an embodiment, the metal layer and the metal control gate structure are formed of the same metal. This simplifies the manufacturing process of the semiconductor storage device. An example of a suitable metal for forming the control gate structure is tungsten.

The disclosed semiconductor storage device may be an embedded device included in an electronic device such as a mobile communications device, a consumer electronic device, a medical device, an automotive device and so on. At least part of the electronic circuitry of the electronic device may be formed on the same semiconductor substrate on which the semiconductor storage device is formed. Alternatively, the electronic circuitry of the electronic device may be entirely formed on a separate semiconductor substrate with the respective semiconductor substrates for instance being mounted on a suitable carrier such as a printed circuit board, a system in package, a multichip module and so on.

According to a further aspect, there is provided a method of manufacturing a semiconductor storage device, comprising providing a semiconductor substrate having a first region of a first conductivity type in between respective regions of an opposite conductivity type; covering at least the first region with a first dielectric layer; forming a polysilicon floating on the first dielectric layer over the first region, surrounding said floating gate by an insulating material; and forming a metal control gate structure adjacent to the polysilicon floating gate at a distance such that the metal control gate structure is capacitively coupled to the floating gate. Such a method is suitable for manufacturing semiconductor storage devices in deep sub-micron technologies such as deep sub-micron CMOS.

BRIEF DESCRIPTION OF THE DRAWINGS

Exemplary embodiments are described in more detail and by way of non-limiting examples with reference to the accompanying drawings, wherein.

DETAILED DESCRIPTION

It should be understood that the figures are merely schematic and are not drawn to scale. It should also be understood that the same reference numerals are used throughout the figures to indicate the same or similar parts.

The present disclosure reflects a realization that in the design rules of most semiconductor technologies such as most CMOS processes, the minimum allowable space between a metal contact to a polysilicon line is smaller than the minimum allowable space between two polysilicon lines. For instance, in a 45 nm CMOS technology, the minimum allowable space between two polysilicon lines is defined at 100 nm whereas the minimum allowable space between a metal contact and a polysilicon line is 40 nm only. Similarly, in a 140 nm CMOS technology (CMOS14), the minimum allowable space between two polysilicon lines is 200 nm, whereas the minimum allowable space between a metal contact and a polysilicon line is only 120 nm.

In many of such semiconductor technologies, it is also possible to shape a metal contact in the form of a metal contact line, which is sometimes referred to as a contact bar or a local interconnect line (LIL). For instance, in 140 nm CMOS, the minimum allowable space between a local interconnect line and a polysilicon line is comparable to the minimum allowable distance between a single contact and a polysilicon line; a typical example of such an allowable distance may be 120 nm in a 140 nm CMOS technology. Hence, it is possible in such semiconductor technologies to create relatively large area metal structures. It has been realized that such a relatively large area metal structure can be placed close to a polysilicon floating gate, thereby introducing a large capacitive coupling between the metal structure and the floating gate. In other words, the use of such a metal structure as a control gate allows for a significant reduction of the minimum voltage required to program the floating gate compared to semiconductor storage devices in which both the control gate as well as the floating gate are polysilicon structures.

Figure 1:
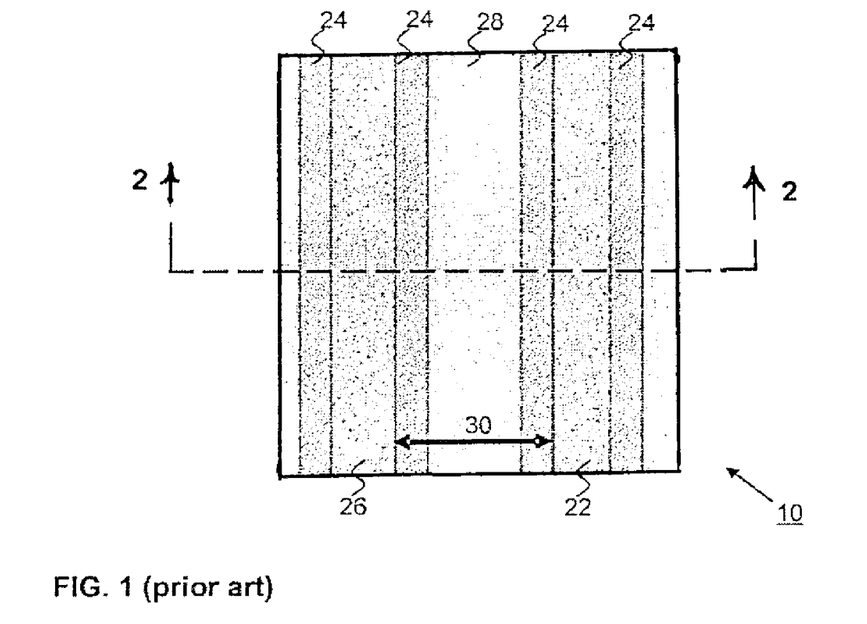
FIGS. 1 and 2 schematically depict different design aspects of a part of a prior art semiconductor storage device.
Figure 2:
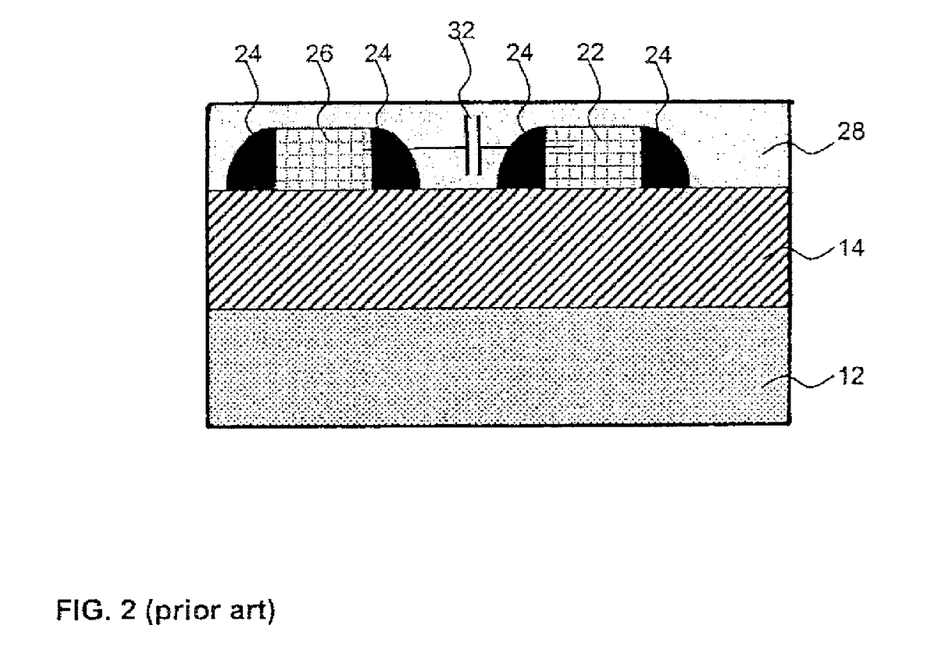

This is explained in more detail with the aid of FIG. 1-4. In FIG. 1, a top view of a part of a prior art semiconductor storage device 10, a multiple-times programmable (MTP) non-volatile memory (NVM) cell, is shown. FIG. 2 shows a cross-section of the prior art semiconductor storage device 10 along the line 2-2. The prior art semiconductor storage device 10 works as follows.

A small polysilicon floating gate 22 is crossing an active line (not shown) formed in the semiconductor substrate 12, which extends on to shallow trench insulation 14. The active line typically comprises a channel region of a first conductivity type in between source and drain regions of an opposite conductivity type. The polysilicon floating gate 22 is typically arranged over the channel region and surrounded by nitride spacers 24. A polysilicon control gate 26, which is also surrounded by nitride spaces 24, is placed on shallow trench insulation 14 as close as possible to the floating gate 22, i.e. at the minimum distance according to the design rules. The polysilicon control gate 26 surrounds the floating gate 22 as much as possible to maximize the capacitive coupling between these gate structures.

The parallel run length between the control gate 26 and the floating gate 22 is chosen to be large enough to ensure that the capacitance formed by the control gate 26, the floating gate 22, and the oxide 28 in between these gates is about 10 times higher than the capacitance between the floating gate 22 and the semiconductor substrate 12. This ensures that the memory for instance can be programmed by a Fowler-Nordheim tunneling mechanism.

For instance, when programming an NMOS memory cell, a high positive voltage may be applied to the control gate 26 with the substrate voltage maintained at 0V. As the floating gate 22 is capacitively coupled mainly to the control gate 26, the voltage of the floating gate 22 will rise to almost the control gate voltage; $10/11 \approx 0.9$ of the control gate voltage. Consequently, a large voltage drop will be present across the tunnel oxide (not shown) of the floating gate 22 such that when the electric field is sufficiently large (roughly 10

MV/cm), electrons start to tunnel from the semiconductor substrate 12 to the floating gate 22. Since the floating gate 22 is isolated from the outside world by dielectrics, the injected electrons into the floating gate 22 will remain on this gate, thus causing a shift of the threshold voltage ($V_T$) of the floating gate transistor, and enabling data storage in such a device. Data erasing can be invoked in the same way by applying a negative voltage on the control gate 26, thus causing electrons to tunnel back from the floating gate 22 to the semiconductor substrate 12.

Figure 3:
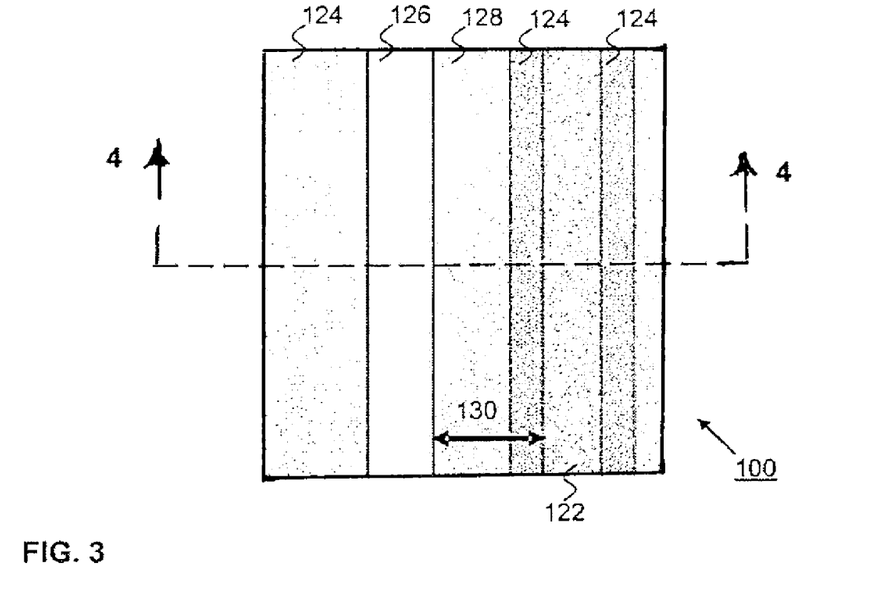
FIGS. 3 and 4 schematically depict different design aspects of a part of a semiconductor storage device in accordance with an embodiment of the present disclosure.
Figure 4:
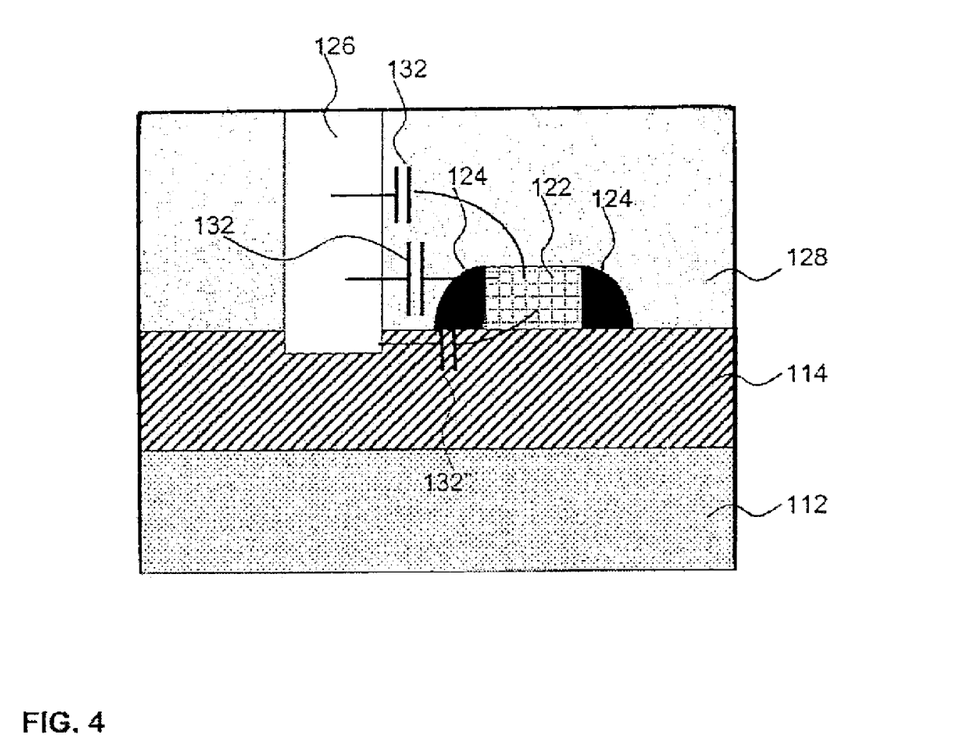

In FIG. 3, a top view of a part of a semiconductor storage device 100 in accordance with an embodiment of the present disclosure is shown. FIG. 4 shows a cross-section of a part of the semiconductor storage device 100 along the line 4-4.

A polysilicon floating gate 122 is crossing an active line (not shown) formed in the semiconductor substrate 112, which extends on to shallow trench insulation 114. The active line typically comprises a channel region of a first conductivity type in between source and drain regions of an opposite conductivity type. The active line, or at least the channel region, is typically covered by a dielectric material such as a gate or tunnel oxide (not shown). The polysilicon floating gate 122 is typically arranged on top of this dielectric material over the channel region and surrounded by spacers 124 of a suitable material such as nitride and embedded in an electrically insulating material 128, such as an oxide or another suitable insulating material. The spacers 124 are used for conventional CMOS process reasons such as the prevention of silicide bridge formation and the separation of light and heavily doped drain implants and are not essential.

A metal control gate 126, for instance a tungsten control gate 126, is also placed on the shallow trench insulation 114 as close as possible to the polysilicon floating gate 122, i.e. at the minimum distance according to the design rules in the relevant semiconductor technology. Similar to the prior art device, the metal control gate 126 also surrounds the polysilicon floating gate 122 as much as possible to maximize the capacitive coupling between these gate structures.

It will be appreciated that there are two major differences between the prior art semiconductor storage device 10 and the semiconductor storage device 100 of the present disclosure. First of all, as already explained previously, the distance 130 between the metal control gate 126 and the polysilicon floating gate 122 is significantly smaller than the minimum allowable distance 30 between the polysilicon control gate 26 and floating gate 22 in the prior art device 10. In addition, due to the fact that the metal control gate 126 can be constructed to be significantly higher than the polysilicon floating gate for another 22, the semiconductor storage device 100 further comprises fringe capacitances 132' and 132" in addition to the lateral capacitance 132 formed by the metal control gate 126, insulating material 128, the spacer 124 and the polysilicon floating gate 122, which further increases the capacitive coupling between these gate structures.

The improvement achieved by the semiconductor storage device 100 compared to the prior art semiconductor storage device 10 will now be explained in more detail by means of an example semiconductor technology, for which a 140 nm CMOS process has been chosen. In this process, the minimum allowable distance between two polysilicon lines may for instance be chosen to be 200 nm, whereas the minimum allowable distance between a metal structure such as a LIL and a polysilicon line may be chosen to be 120 nm. It is pointed out that these design rule values are given as non-limiting examples only since it will be apparent to the skilled person that such values may be varied within certain limits.

The nitride spacers in this technology are estimated to be approximately 60 nm wide with a dielectric constant of $\epsilon_N=7$. The oxide layer 128 has a dielectric constant of $\epsilon_{ox}$ 4.2. The height of the polysilicon gate structures is h=180 nm. The maximum capacitance formed by the polysilicon control gate 26 and the polysilicon floating gate 22 in the prior art semiconductor storage device 10 can be expressed as:

$$C_{poly-poly}=(\epsilon_{ox}h.L)/EOT_{poly-poly}$$

where $EOT_{poly-poly}$ is the equivalent oxide thickness with $EOT_{poly-poly}=(2*60)* \epsilon_{ox}/\epsilon_N+80=152$ nm.

In the case of the metal-to poly capacitance between the metal control gate 126 and the polysilicon floating gate 122 in the semiconductor device 100, this capacitance may be expressed as:

$$C_{metal-poly}=(\epsilon_{ox}h.L)/EOT_{metal-poly}$$

where $EOT_{metal-poly}=(60)*\epsilon_{ox}/\epsilon_N+60=96$ nm.

It will be immediately apparent that the main capacitance 132 of the capacitor formed by the metal control gate 126, the floating gate 122 and dielectric material separating these gates is approximately 152/96=1.58 times higher than the poly-to poly capacitance of the prior art semiconductor storage device 10.

This ratio may be further improved by ensuring that the height of the control gate 126 is much larger than the height of the polysilicon floating gate 122 such that the aforementioned fringe capacitance 132' also contribute to the overall capacitance. Moreover, because in practice the metal control gate 126 will penetrate the shallow trench insulation 114 by at least a few tens of nm, an additional fringe capacitance 132" will further increase the overall capacitance of the storage cell of the semiconductor storage device 100.

In the semiconductor storage device 100, as opposed to a polysilicon control gate 26, the metal control gate 126 does not suffer from poly depletion issues that contribute to the EOT and has normally a detrimental effect on, i.e. Increases, the program or erase voltage of such a storage cell.

A metal control gate 126 has a much lower sheet resistance, which improves the read-out speed of the semiconductor storage device 100.

It should be understood that FIG. 4 is a simplified representation of such a semiconductor storage device. For instance, additional structures such as additional dielectric layers located on top of the polysilicon floating gate 122 may be present without departing from the teachings of the present disclosure.

Figure 5:
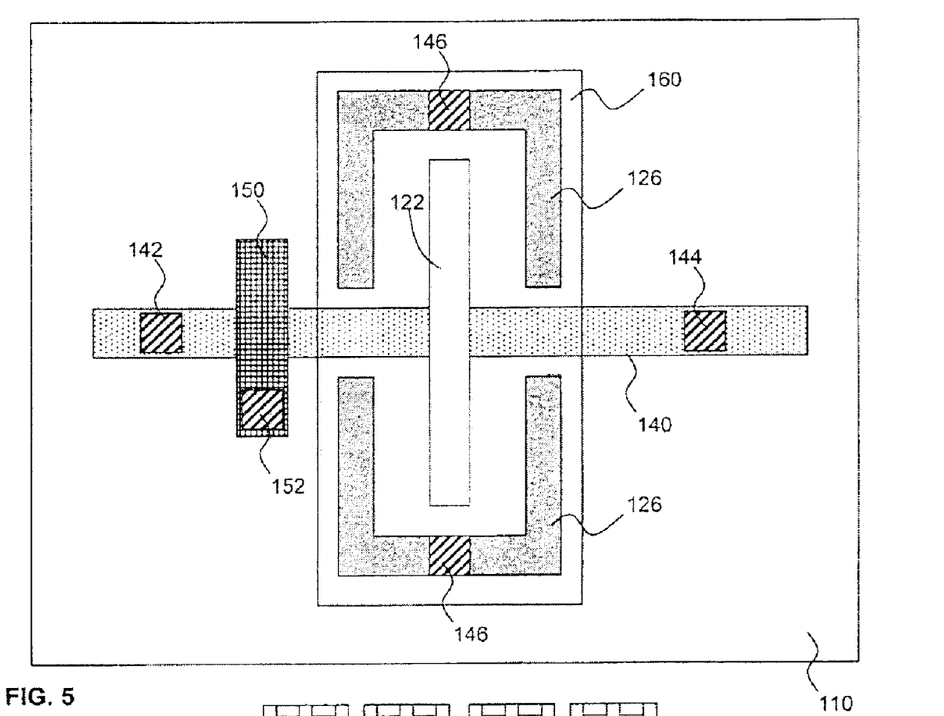
FIG. 5 schematically depicts another view of a semiconductor storage device of FIG. 4.

In an embodiment, the storage cell the semiconductor storage device 100 comprises a metal control gate 126 shaped as a metal contact bar or LIL as shown in FIG. 5. In FIG. 5, the metal control gate 126 is shaped such that this gate partially surrounds the polysilicon floating gate 122 to maximize the capacitive coupling between these gates.

It is noted that the storage cell shown in FIG. 5 is an example of a 2-transistor (2T) cell according to an embodiment in which an access or selection transistor is placed next to the memory transistor and used as an enable device. FIG. 5 shows the polysilicon gate 150 of this access transistor.

In order to increase the capacitive coupling between the control gate 126 and the polysilicon floating gate 122 even further, the first metal layer 160, which provides the interconnect structure to the respective contact pads 142 (to a source region), 144 (to a drain region), 146 (to the metal control gate 126) and 152 (to the polysilicon gate 150 of the access transistor) can be shaped to cover a large area of the floating gate 122.

In a preferred embodiment, the access transistor comprising the polysilicon gate 150 as well as the storage transistor comprising the polysilicon floating gate 126 is located in a single well 110 in the semiconductor substrate 112. Typically, the semiconductor storage device 100 will comprise a plurality of such wells. The single well 110 may be an N-type well or a P-type well depending on the conductivity type of the storage transistor (and access transistor if present). The storage transistor (and access transistor if present) may be realized as a PMOS or as an NMOS transistor, amongst others.

It should be appreciated that FIG. 5 gives a non-limiting example only of a possible storage cell layout, and many different layouts are suitable to achieve an improved capacitive coupling coefficient between the metal control gate 126 and the polysilicon floating gate 122. For instance, FIG. 6 depicts a part of a semiconductor storage device in accordance with an embodiment in which a memory array comprising a storage cell 170 is shown, which comprises a comb-like or interdigitated metal control gate 126 and polysilicon floating gate 122 to maximize the capacitive coupling between these gates.

Figure 6:
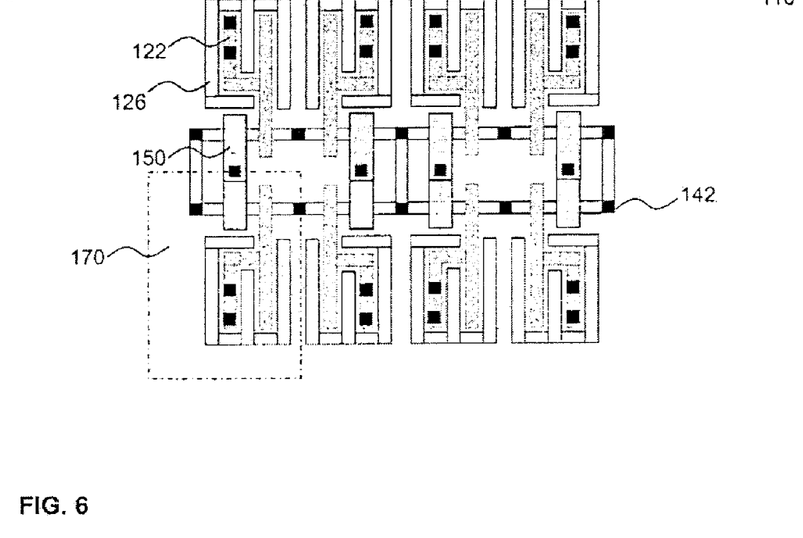
FIG. 6 schematically depicts a semiconductor storage device according to an embodiment that comprises multiple storage elements.

FIG. 6 is a memory array in which the 2-T memory cells 170, as is apparent from the presence of the polysilicon gate 150 of the access transistor, share a common source structure that is periodically connected by source contacts 142. Such a configuration is commonly known as a NOR configuration. It is pointed out that alternative configurations, such as an AND configuration in which different rows of the memory array have their own source lines, are equally feasible.

Figure 7:
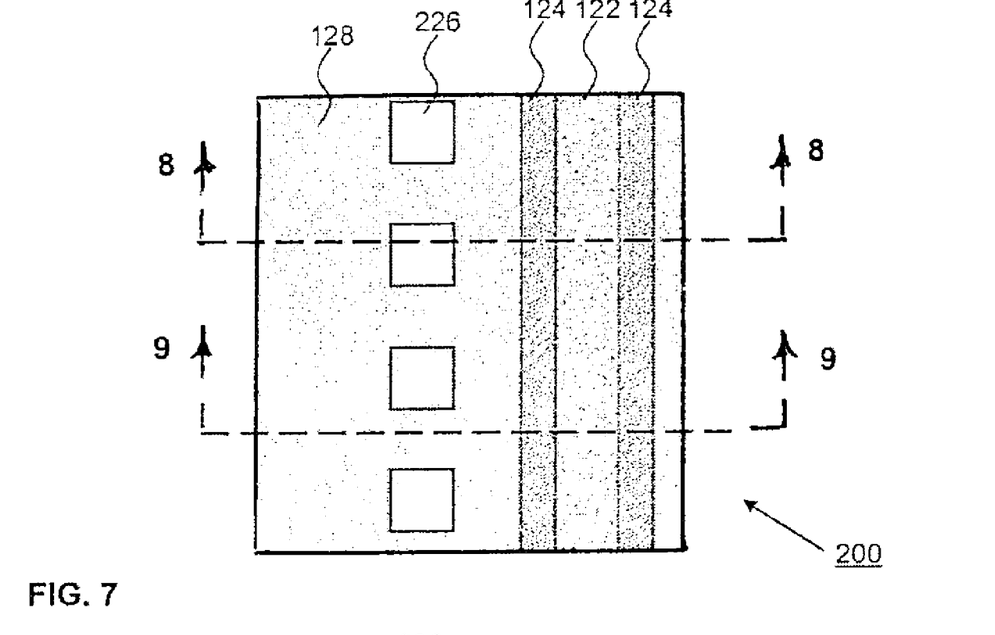
FIG. 7-9 schematically depict various views of parts of a semiconductor storage device in accordance with another embodiment.
Figure 8:
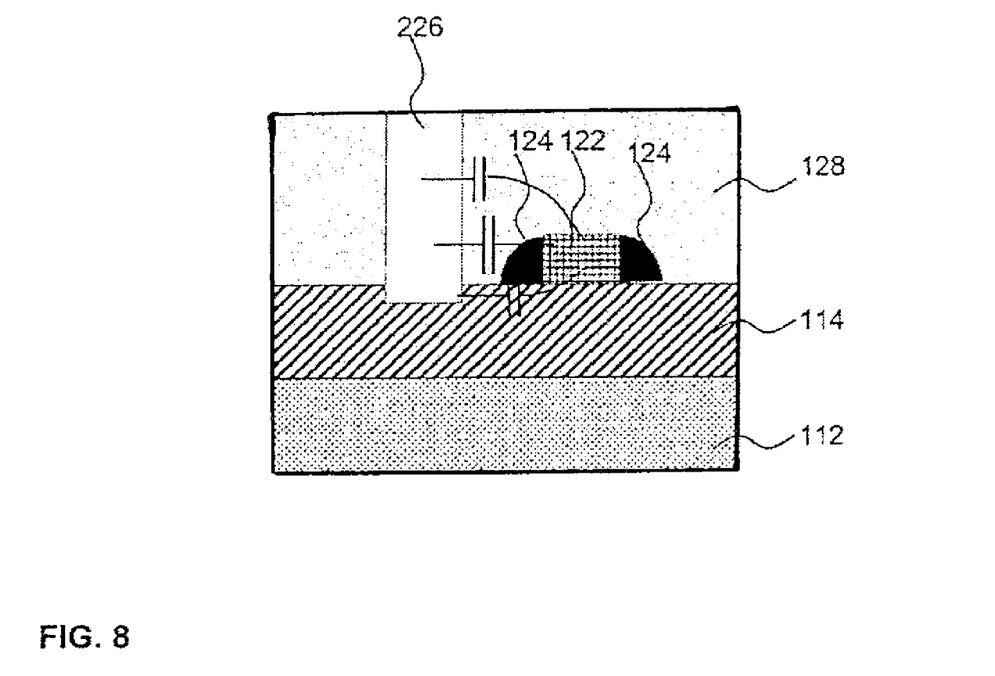
Figure 9:
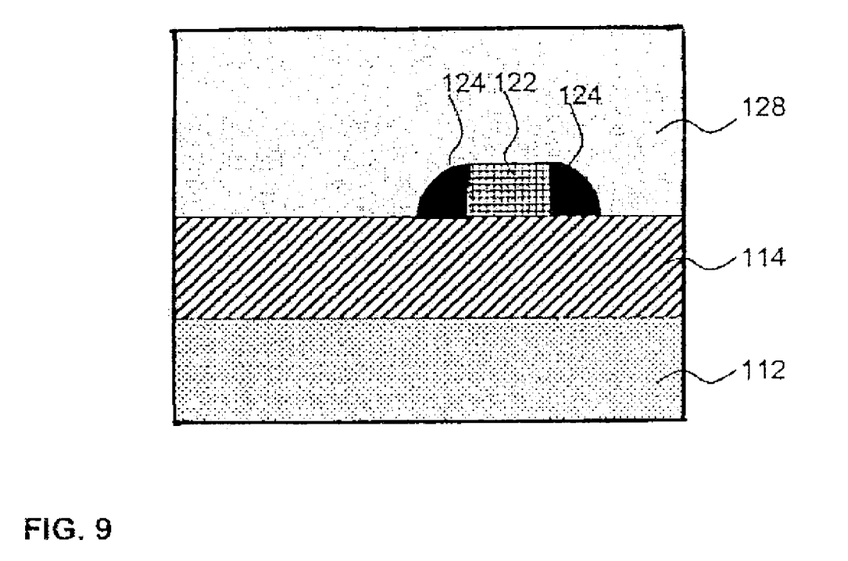

In FIG. 7, a top view of a part of a semiconductor storage device 200 in accordance with another embodiment is shown. FIG. 8 shows a cross-section of a part of the semiconductor storage device 200 along the line 8-8 and FIG. 9 shows a cross-section of a part of the semiconductor storage device 200 along the line 9-9. In the semiconductor storage device 200, the continuous metal control gate structure 126 is replaced by a metal control gate structure formed by a row of multiple contacts 226. Although it is recognized that this arrangement is likely to have a reduced capacitive coupling with the polysilicon floating gate 122, this option could be used in a CMOS generations where the design rules do not allow the use of contact bars or LIL structures.

In order to minimize the reduction in capacitive coupling, the spacing between the multiple metal contacts 226 should be minimized in accordance with the appropriate design rules. It is expected that in this case, the coupling coefficient will not be significantly affected since the closely spaced metal contacts 226 will shield the floating gate 122 from interference with other lines which are at different potential compared to the control gate structure 226. For the sake of completeness, it is pointed out that preferably each metal portion 226 is connected to the first metal layer 160.

It is noted that although most design rules stipulate that a contact on shallow trench insulation 114 is only allowed when silicon or polysilicon is contacted, in this particular embodiment this contact is merely used to couple a voltage to the polysilicon floating gate 122 by contacting the metal control gate structure 226 such that technologically speaking there is no objection to violate the design rules because this violation does not introduce a reliability threat to the semiconductor storage device 200. It should be appreciated that for a metal control gate structure 126 such as a LIL, this is not an issue since a LIL is allowed on a shallow trench insulation 114 in many design rules such as the design rules of a 140 nm CMOS process.

Figure 10:
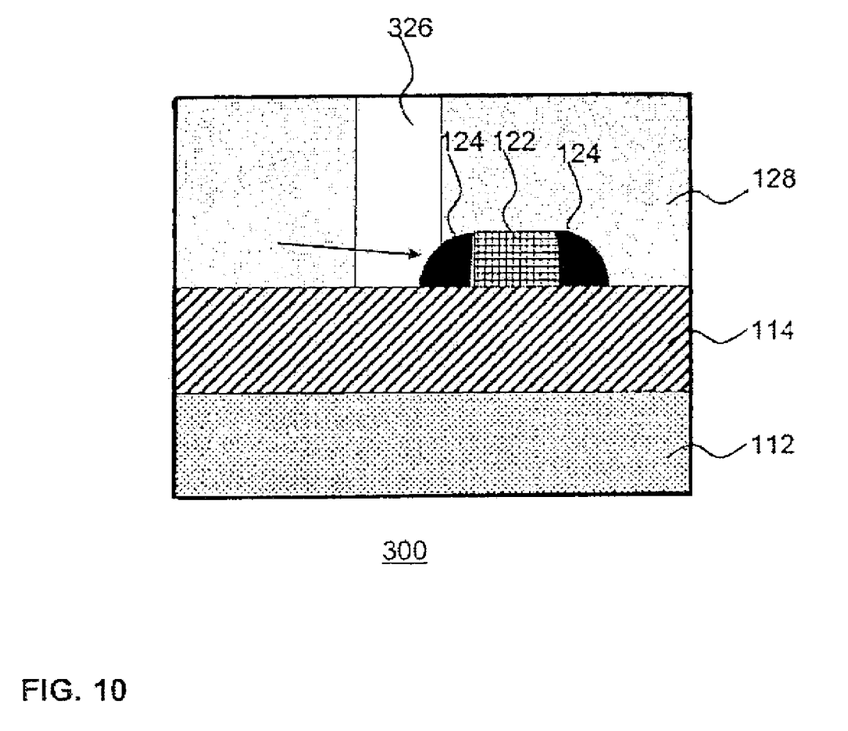
FIG. 10 schematically depicts a part of a semiconductor storage device in accordance with yet another embodiment.

In FIG. 10, a cross-section of a part of a semiconductor storage device 300 in accordance with yet another embodiment is shown. In this embodiment, a metal control gate structure 326, e.g. a metal LIL or contact bar, partially overlaps the spacer 124 that surrounds the polysilicon floating gate 122. This embodiment is of particular relevance in advanced semiconductor technology generations such as a 45 nm CMOS process, in which the minimum allowable space between a metal contact and a polysilicon structure may be chosen to be as low as 40 nm, and wherein the width of the spacers 124 can easily exceed this distance. It will be appreciated that in this embodiment, the capacitive coupling between the metal control gate structure 326 and the polysilicon floating gate 122 will be further improved, thanks to the fact that the dielectric medium between the metal control gate structure 326 and the polysilicon floating gate 122 is mainly formed by nitride materials which have a k-value of around 7.

The semiconductor storage device of the various disclosed embodiments may be programmed in any suitable way, such as by Fowler-Nordheim tunnelling. This tunnelling principle is well-known to the skilled person and will not be further explained for reasons of brevity only. Alternative lower voltage programming and erasing methods such as Channel Hot Electron-injection and Punch-through Assisted Hot Hole Injection requiring the use of an additional MOS enable transistor for selecting the storage transistor to be programmed or erased are also feasible.

Since it is known per se how to form (patterned) metal (gate) structures on a semiconductor substrate, this has not been explained further for reasons of brevity only. Techniques for forming such metal structures are readily available in most conventional semiconductor processes such as CMOS processes. A suitable method for manufacturing a semiconductor storage device in accordance with one of the aforementioned embodiments typically includes the steps of providing a semiconductor substrate having a first region of a first conductivity type in between respective regions of an opposite conductivity type, covering at least the first region with a first dielectric layer, forming a polysilicon floating gate on the first dielectric layer over the first region, embedding said floating gate in an insulating material; and forming a metal control gate structure adjacent to the polysilicon floating gate at a distance such that the metal control gate structure is capacitively coupled to the floating gate.

The first conductivity type may be N-type or P-type with the opposite conductivity type being P-type or N-type respectively. The respective regions typically comprise a source region and a drain region, which may be formed by conventional implantation steps. The first dielectric layer, e.g. a tunnel oxide layer, may be grown and patterned in any suitable way and the polysilicon floating gate 122 may be formed on top of this first dielectric layer using any suitable step such as the deposition and subsequent patterning of a polysilicon layer. Spacers may be grown around the gate in any suitable way and the resulting structure may be embedded in any suitable dielectric medium such as silicon oxide. The metal control gate structure, for instance control gate structure 126 may be formed in any suitable way, e.g. by forming a trench in the dielectric medium and subsequently filling this trench with the metal. Alternative embodiments of this method, in which an alternative sequence of the aforementioned method steps or in which alternative embodiments of the aforementioned method steps are used will be immediately apparent to the skilled person.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

What is claimed is:

1. A semiconductor storage device comprising:
    a semiconductor substrate having a first region of a first conductivity type in between respective regions of an opposite conductivity type, at least the first region being covered by a first dielectric layer;
    a polysilicon floating gate placed on the first dielectric layer over the first region, said floating gate being surrounded by an insulating material; and
    a metal control gate structure adjacent to the polysilicon floating gate without overlapping the polysilicon floating gate, the metal control gate structure being capacitively coupled to said floating gate, wherein the metal control gate structure extends a first height from the first dielectric layer and the polysilicon floating gate extends a second height from the first dielectric layer, the first height being greater than the second height.

2. The semiconductor storage device of claim 1, wherein the metal control gate structure and the polysilicon floating gate are interdigitated.

3. The semiconductor storage device of claim 1, wherein the metal control gate structure comprises a plurality of metal portions separated from each other by a further insulating material.

4. The semiconductor storage device of claim 1, wherein the metal control gate structure comprises a local interconnect line.

5. The semiconductor storage device of claim 1, further comprising:
    a second region of the first conductivity type in between one of said respective regions and a further region of the opposite conductivity type, at least said second region being covered by a further dielectric layer; and
    a further gate placed on the further dielectric layer over the second region.

6. The semiconductor storage device of claim 5, wherein the first dielectric layer and the further dielectric layer are the same layer.

7. The semiconductor storage device of claim 5, wherein the semiconductor substrate comprises a plurality of electrically insulated wells, and wherein the respective regions of the first and opposite conductivity types are located within a single one of said wells.

8. The semiconductor storage device of claim 1, wherein the metal control gate structure is separated from the semiconductor substrate by a second dielectric layer.

9. The semiconductor storage device of claim 8, wherein the second dielectric layer has a different thickness than the first dielectric layer.

10. The semiconductor storage device of claim 1, wherein the metal control gate structure partially covers the insulating material.

11. The semiconductor storage device of claim 1, further comprising a metal layer for contacting respective active regions of the semiconductor storage device, the metal layer and the metal control gate structure being formed of the same metal.

12. The semiconductor storage device of claim 11, wherein the metal is tungsten.

13. The semiconductor storage device of claim 1, wherein the polysilicon floating gate structure does not overlap the metal control gate structure.

14. An electronic device comprising a semiconductor storage device that includes:
    a semiconductor substrate having a first region of a first conductivity type in between respective regions of an opposite conductivity type, at least the first region being covered by a shallow trench isolation structure;
    a polysilicon floating gate placed on the shallow trench isolation structure over the first region, said floating gate being surrounded by an insulating material; and
    a metal control gate structure adjacent to the polysilicon floating gate and embedded in the shallow trench isolation structure, the metal control gate structure being capacitively coupled to said floating gate.

15. The electronic device of claim 14, wherein the metal control gate structure does not overlap the polysilicon floating gate and wherein the polysilicon floating gate structure does not overlap the metal control gate structure.

16. The electronic device of claim 14, wherein the metal control gate structure extends a first height from a top surface of the shallow trench isolation structure and the polysilicon floating gate extends a second height from the top surface of the shallow trench isolation structure, the first height being greater than the second height.

17. A method of manufacturing a semiconductor storage device, comprising:
    providing a semiconductor substrate having a first region of a first conductivity type in between respective regions of an opposite conductivity type;
    covering at least the first region with a first dielectric layer;
    forming a polysilicon floating gate on the first dielectric layer over the first region, surrounding said floating gate with an insulating material; and
    after forming the polysilicon floating gate, forming a metal control gate structure adjacent to the polysilicon floating gate without overlapping the polysilicon floating gate and at a distance such that the metal control gate structure is capacitively coupled to the floating gate.

18. The method of claim 17, wherein the metal control gate structure extends a first height from the first dielectric layer and the polysilicon floating gate extends a second height from the first dielectric layer, the first height being greater than the second height.

19. The method of claim 17, wherein the first dielectric layer is a shallow trench isolation structure and the metal control gate structure is embedded in the shallow trench isolation structure.

* * * * *